(12) United States Patent
Saito et al.

(10) Patent No.: US 9,378,942 B2
(45) Date of Patent: Jun. 28, 2016

(54) DEPOSITION METHOD AND DEPOSITION APPARATUS

(71) Applicant: TOKYO ELECTRON LIMITED, Tokyo (JP)

(72) Inventors: Takehisa Saito, Miyagi (JP); Atsutoshi Inokuchi, Miyagi (JP); Shogo Masuda, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 31 days.

(21) Appl. No.: 14/041,004

(22) Filed: Sep. 30, 2013

(65) Prior Publication Data
US 2014/0099734 A1 Apr. 10, 2014

(30) Foreign Application Priority Data
Oct. 4, 2012 (JP) .................. 2012-222474

(51) Int. Cl.
| | |
|---|---|
| *H01L 21/471* | (2006.01) |
| *H01L 21/02* | (2006.01) |
| *C23C 16/511* | (2006.01) |
| *C23C 16/04* | (2006.01) |
| *C23C 16/34* | (2006.01) |
| *C23C 16/56* | (2006.01) |
| *H01J 37/32* | (2006.01) |

(52) U.S. Cl.
CPC .......... *H01L 21/0226* (2013.01); *C23C 16/045* (2013.01); *C23C 16/345* (2013.01); *C23C 16/511* (2013.01); *C23C 16/56* (2013.01); *H01J 37/32192* (2013.01); *H01J 37/32238* (2013.01); *H01J 37/32449* (2013.01); *H01L 21/0217* (2013.01); *H01L 21/02219* (2013.01); *H01L 21/02274* (2013.01); *H01L 21/02329* (2013.01)

(58) Field of Classification Search
None
See application file for complete search history.

(56) References Cited

U.S. PATENT DOCUMENTS

| | | | |
|---|---|---|---|
| 7,544,983 B2* | 6/2009 | Yang | 257/295 |
| 2005/0092437 A1* | 5/2005 | Ohmi et al. | 156/345.41 |
| 2013/0196516 A1* | 8/2013 | Lavoie | H01L 21/02126 438/776 |
| 2013/0217240 A1* | 8/2013 | Mallick et al. | 438/778 |
| 2014/0073114 A1* | 3/2014 | Cen et al. | 438/466 |
| 2014/0073144 A1* | 3/2014 | Chatterjee et al. | 438/793 |
| 2014/0256153 A1* | 9/2014 | Grill | H01L 21/76283 438/762 |

FOREIGN PATENT DOCUMENTS

| | | |
|---|---|---|
| JP | 2010-87186 A | 4/2010 |
| WO | 2007/139140 A1 | 12/2007 |

* cited by examiner

*Primary Examiner* — Zandra Smith
*Assistant Examiner* — Molly Reida
(74) *Attorney, Agent, or Firm* — Rothwell, Figg, Ernst & Manbeck, P.C.

(57) ABSTRACT

Disclosed is a method for depositing an insulating film with a high coverage through a low temperature process. The deposition method deposits an insulating film on a substrate using a deposition apparatus which includes a processing container that defines a processing space in which plasma is generated, a gas supply unit configured to supply a gas into the processing space, and a plasma generating unit configured to generate plasma by supplying microwave into the processing container. The deposition method includes depositing an insulating film that includes SiN on the substrate by supplying into a gas formed by adding $H_2$ to trisilylamine into the processing container and generating plasma.

4 Claims, 20 Drawing Sheets

*FIG.8*

| PRECURSOR | SiH$_3$ | (SiH$_3$)$_2$N-SiH$_2$ | SiH$_3$NH-SiH$_2$ | NH$_2$-SiH$_2$ |
|---|---|---|---|---|
| RELATIVE ADSORPTION PROBABILITY | 1 | 0.01 | 0.008 | 0.03 |

FIG.12

|  | H₂=35 sccm | H₂=70 sccm | H₂=87 sccm |
|---|---|---|---|
| Tt | 20.0 nm | 19.7 nm | 17.1 nm |
| Ts(COVERAGE) | 16.7 nm (83%) | 17.4 nm (88%) | 15.5 nm (91%) |

DEPOSITION METHOD AND DEPOSITION APPARATUS

CROSS-REFERENCE TO RELATED APPLICATIONS

This application is based on and claims priority from Japanese Patent Application No. 2012-222474, filed on Oct. 4, 2012, with the Japan Patent Office, the disclosure of which is incorporated herein in its entirety by reference.

TECHNICAL FIELD

The present disclosure relates to a deposition (film forming) method and a deposition (film forming) apparatus.

BACKGROUND

It has been known to form a silicon nitride film (SiN film) as an insulating film on a substrate to be processed ("substrate") in order to protect the substrate. For example, Japanese Patent Laid-Open Publication No. 2010-87186 discloses a method of forming a silicon nitride film on a substrate through a plasma CVD method, in which microwave is introduced into a processing container through a planar antenna formed with a plurality of holes to generate plasma. In this method, as an example of a raw material gas used for depositing the silicon nitride film, trisilylamine (TSA) is mentioned. Also, International Publication WO. 2007-139140 discloses a method of forming a SiN film through a plasma CVD method in which silane ($SiH_4$) is used as a deposition raw material gas.

SUMMARY

The present disclosure provides a method of depositing an insulating film on a substrate. The method includes: providing a deposition apparatus including a processing container that defines a processing space in which plasma is generated, a gas supply unit configured to supply a gas into the processing space, and a plasma generating unit configured to generate plasma by supplying microwave into the processing container; and depositing an insulating film that includes SiN on the substrate by supplying a gas formed by adding $H_2$ to trisilylamine into the processing container and generating plasma in the processing space.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 8 is a view illustrating adsorption probabilities of precursors on Si.

FIG. 12 is a view illustrating the coverage of an insulator obtained from Example 1.

DETAILED DESCRIPTION

Figure 1:
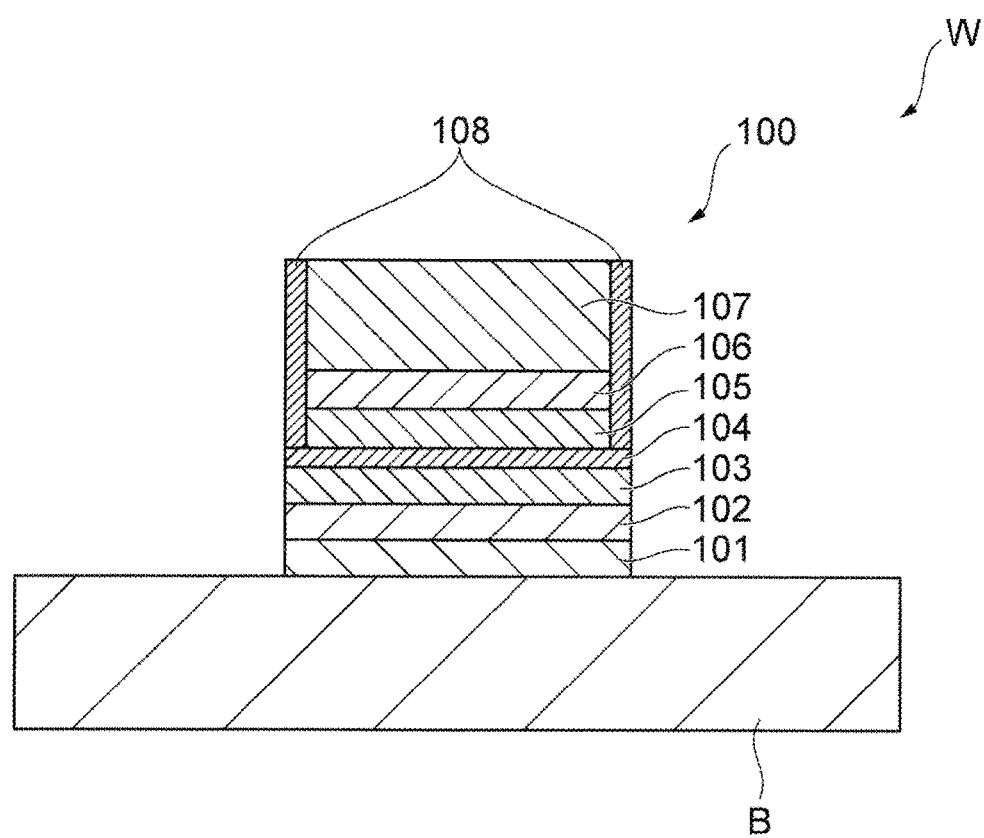
FIG. 1 is a view schematically illustrating a MRAM device deposited with an insulating film by using a deposition method according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

As the pattern of semiconductor devices has recently been miniaturized, it is required to improve a coverage which allows a SiN film to be deposited with a high coatability on lateral surfaces or bottom surfaces of micro structures such as, for example, holes or grooves formed in a substrate. Also, in order to suppress deterioration of a substrate, a process of depositing a SiN film at a low temperature is required. However, in the above described conventional methods, a condition for depositing a SiN film, which allows a high coverage to be achieved through a low temperature process, is not disclosed. Thus, what is demanded in the related art is a deposition method that satisfies such requirement.

According to an aspect of the present disclosure, provided is a method of depositing an insulating film on a substrate. The deposition method includes: providing a deposition apparatus including a processing container that defines a processing space in which plasma is generated, a gas supply unit configured to supply a gas into the processing space, and a plasma generating unit configured to generate plasma by supplying microwave into the processing container; and depositing an insulating film that includes SiN on the substrate by supplying a gas formed by adding $H_2$ to trisilylamine into the processing container and generating plasma in the processing space.

In the deposition method according to the first aspect of the present disclosure, since the plasma is generated by supplying the microwave into the processing container, the insulating film may be deposited at a low temperature. Also, since the gas formed by adding $H_2$ to trisilylamine is supplied during the deposition of the insulation film, the coverage of the insulating film deposited on the substrate is improved. This is because, as adsorption probabilities of precursors of film forming materials on the substrate are decreased, the insulating film may be isotropically grown, thereby improving the coverage. When $H_2$ is added to trisilylamine, $H_2$ is adsorbed on the substrate surface, thereby reducing the adsorption probabilities of the precursors on the substrate.

In an exemplary embodiment, the deposition method may further include, after the depositing of the insulating film, nitriding the insulating film by supplying a gas including $N_2$, and generating plasma. In order to improve the coverage, when $H_2$ is added to trisilylamine when depositing the insulating film, the amount of SiH may be increased in the insulating film, thereby deteriorating the insulation characteristic. In the deposition method according to the present disclosure, nitriding may reduce the amount of SiH in the insulating film, thereby suppressing deterioration of the insulation characteristic of the insulating film.

In another exemplary embodiment, the insulating film may be deposited by repeating the depositing and the nitriding plural times. In this manner, the insulating film which is superior in insulation characteristic may be formed to a required film thickness while maintaining a good coverage property.

In still another exemplary embodiment, during the depositing of the insulating film, the pressure within the processing container may be controlled to be 400 mTorr or more. When the inside of the processing container is under a high pressure, a mean free path may be shortened, and the precursors that contributes to the deposition of the insulating film may easily move in random directions. Thus, under the high pressure condition of 400 mTorr or more, the precursors may be uniformly grown on the substrate surface, thereby improving the coverage property of an insulator.

In yet another exemplary embodiment, the substrate may include a layered structure in which a first magnetic layer and a second magnetic layer are stacked with a tunnel barrier layer interposed therebetween. With this configuration, the insulating layer with a good film property may be deposited on a lateral surface of the layered structure. Thus, the substrate may be coated and sealed with the insulating film to suppress the deterioration of the substrate.

According to a second aspect of the present disclosure, provided is an apparatus of depositing a film on a substrate. The deposition apparatus includes: a processing container that defines a processing space in which plasma is generated, a gas supply unit configured to supply a gas into the processing space, a plasma generating unit configured to generate plasma by supplying microwave into the processing container, and a control unit configured to control the gas supply unit and the plasma generating unit in such a manner that a gas formed by adding $H_2$ to trisilylamine is supplied into the processing container and plasma is generated so as to form an SiN film on the substrate.

In the deposition apparatus according to the second aspect, since plasma is generated by supplying microwave into the processing container, the insulating film may be deposited at a low temperature. Also, since the gas formed by adding $H_2$ to trisilylamine is supplied during the deposition of the insulating film, the coverage of the insulating film deposited on the substrate is improved. This is because, as adsorption probabilities of precursors of film forming materials on the substrate are decreased, the insulating film may be isotropically grown, thereby improving the coverage. When $H_2$ is added to trisilylamine, $H_2$ is adsorbed on the substrate surface, thereby reducing the adsorption probabilities of the precursors on the substrate.

According to aspects and exemplary embodiments of the present disclosure, an insulating film with a high coverage may be deposited through a low temperature process.

Hereinafter, various exemplary embodiments will be described in detail with reference to drawings. It is assumed that the same or equivalent parts are given the same numerals in the respective drawings.

First Exemplary Embodiment

FIG. 1 illustrates a cross-sectional view of an MRAM device 100 that has a surface deposited with an insulating film by a deposition method according to an exemplary embodiment. The MRAM device 100 as illustrated in FIG. 1 is disposed on a substrate B, in which a lower electrode layer 101, a pinning layer 102, a second magnetic layer 103, a tunnel barrier layer 104, a first magnetic layer 105, an upper electrode layer 106, and an etching mask 107 are stacked in this order from the bottom. Also, an insulating film 108 that includes SiN is provided on the side walls of the first magnetic layer 105, the upper electrode layer 106, and the etching mask 107 of the MRAM device 100.

The lower electrode layer 101 is an electrically conductive electrode member that is formed on the substrate B. The lower electrode layer 101 has a thickness of, for example, about 5 nm. The pinning layer 102 is disposed between the lower electrode layer 101 and the second magnetic layer 103. The pinning layer 102 pins the magnetization direction of the lower electrode layer 101 through the pinning effect caused by an antiferromagnet. The pinning layer 102 is made of an antiferromagnet material such as, for example, IrMn (iridium manganese) or PtMn (platinum manganese), and has a thickness of, for example, about 7 nm.

The second magnetic layer 103 is a layer that includes a ferromagnet, which is disposed on the pinning layer 102. The second magnetic layer 103 serves as a so-called pinned layer due to a pinning effect caused by the pinning layer 102, in which the magnetization direction is constantly maintained without being affected by an external magnetic field. The second magnetic layer 103 is made of CoFeB, and has a thickness of, for example, about 3 nm.

The tunnel barrier layer 104 is disposed to be sandwiched between the second magnetic layer 103 and the first magnetic layer 105. The interposition of the tunnel barrier layer 104 between the second magnetic layer 103 and the first magnetic layer 105 causes a tunnel magnetoresistance effect between the second magnetic layer 103 and the first magnetic layer 105. That is, between the second magnetic layer 103 and the first magnetic layer 105, electric resistance occurs according to relationship (parallel or antiparallel) of the magnetization direction of the second magnetic layer 103 and the magnetization direction of the first magnetic layer 105. The tunnel barrier layer 104 is made of MgO, and has a thickness of, for example, 1.3 nm.

The first magnetic layer 105 is a layer that includes a ferromagnet, which is disposed on the tunnel barrier layer 104. The first magnetic layer 105 serves as a so-called free layer in which the magnetization direction conforms to the external magnetic field which is magnetic information. The first magnetic layer 105 is made of CoFeB, and has a thickness of, for example, about 2 nm.

The upper electrode layer 106 is an electrically conductive electrode member that is formed on the substrate B. The upper electrode layer 106 has a thickness of, for example, about 5 nm. The etching mask 107 is formed on the upper electrode layer 106. The etching mask 107 is formed in a shape corresponding to the planar shape of the MRAM 100. The etching mask 107 is made of, for example, Ta (tantalum) or TiN (titanium nitride).

Figure 2:
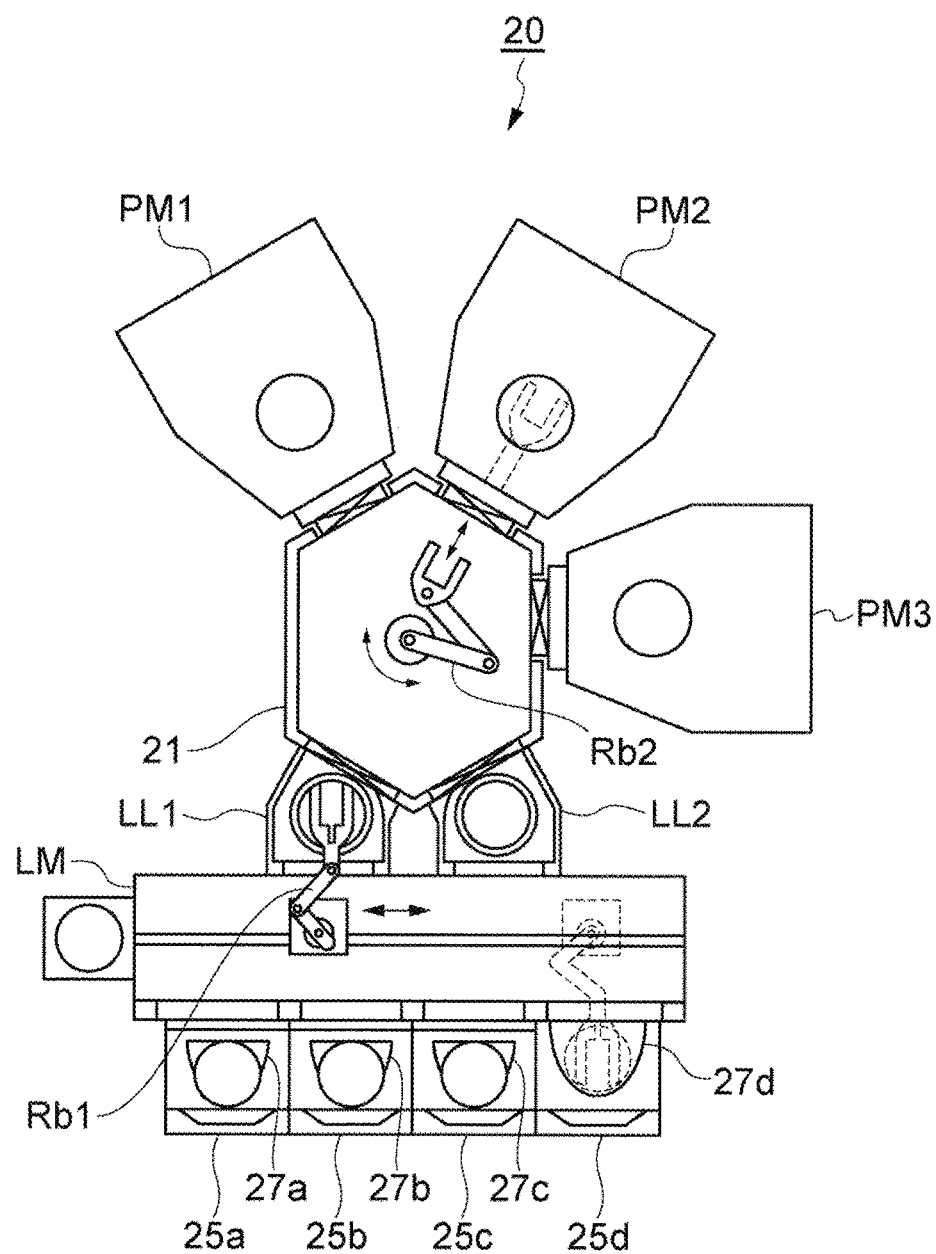
FIG. 2 is a schematic view illustrating a substrate processing system provided with a deposition apparatus according to an exemplary embodiment.

The MRAM 100 is manufactured using, for example, a substrate processing system as illustrated in FIG. 2. FIG. 2 is a plan view schematically illustrating a substrate processing system according to an exemplary embodiment. A substrate processing system 20 as illustrated in FIG. 2 is provided with substrate disposition units 25a to 25d, accommodation containers 27a to 27d, a loader module LM, load lock chambers LL1 and LL2, process modules PM1, PM2, and PM3, and a transfer chamber 21.

The substrate disposition units 25a to 25d are arranged along one edge of the loader module LM. The accommodation containers 27a to 27d are disposed above the substrate disposition unit 25a to 25d, respectively. Substrates to be processed ("substrates") W are accommodated within the accommodation containers 27a to 27d.

A conveying robot Rb1 is provided within the loader module LM. The conveying robot Rb1 takes out a substrate W accommodated in any one of the accommodation containers 24a to 24d, and conveys the substrate W to the load lock chamber LL1 or LL2.

The load lock chambers LL1 and LL2 are provided along the other edge of the loader module LM to constitute preliminary decompression chambers. The load lock chambers LL1 and LL2 are connected to the transfer chamber 21 via gate valves, respectively.

The transfer chamber 21 is a chamber that is capable of being decompressd. Another conveying robot Rb2 is provided within the transfer chamber 21. The transfer chamber 21 is connected to the process modules PM1 to PM3 via corresponding gate valves, respectively. The conveying robot Rb2 takes out a wafer W from the load lock chamber LL1 or LL2, and successively conveys the wafer W to the process modules PM1, PM2, and PM3. The process modules PM1, PM2, and PM3 of the substrate processing system 20 may be a substrate processing apparatus configured to remove a reaction product, a deposition apparatus, and a plasma etching apparatus, respectively. Hereinafter, for convenience of understanding of description, descriptions will be made on a substrate processing system as an example, in which a substrate processing apparatus configured to remove a reaction product is employed as the process module PM1, a deposition apparatus is employed as the process module PM2, and a plasma etching apparatus is employed as a process module PM3.

Figure 3:
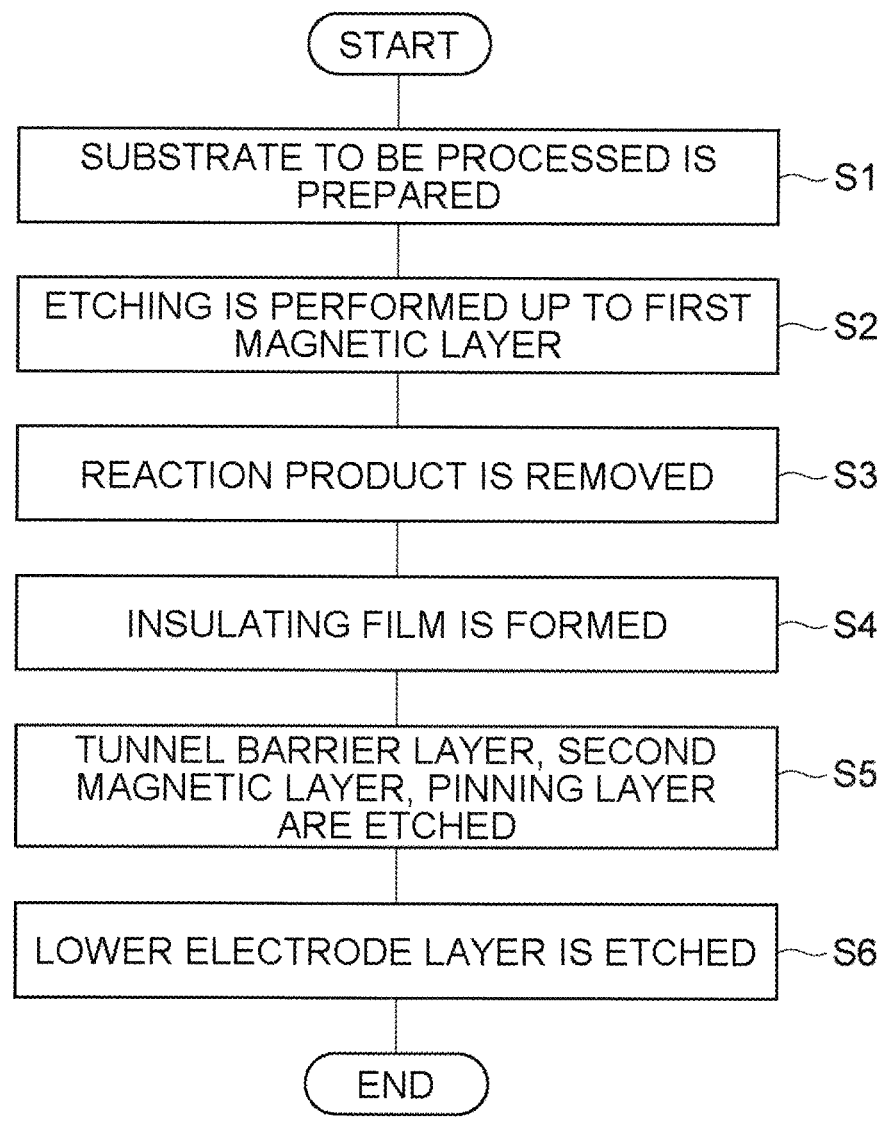
FIG. 3 is a flow chart illustrating a manufacturing process of an MRAM device by using a deposition method according to an exemplary embodiment.

The MRAM 100 is manufactured according to, for example, a flow chart as illustrated in FIG. 3. As illustrated in FIG. 3, in step S1, a substrate W that is constituted by multi-layered films is manufactured by the deposition apparatus as the process module PM2. The substrate W is a multi-layered film material obtained by stacking a lower electrode layer 101, a pinning layer 102, a second magnetic layer 103, a tunnel barrier layer 104, a first magnetic layer 105, and an upper electrode layer 106 on a substrate B. Next, the substrate W is disposed on an electrostatic chuck of the plasma etching apparatus which is the process module PM3. An etching mask 107 formed in a predetermined planar shape is disposed on the upper electrode layer 106.

In step S2, first, the upper electrode layer 106 is etched. An etching gas to be used at this time is arbitrary. For example, $Cl_2$, $CH_4$, He, $N_2$, or Ar may be used. For example, a processing gas that contains chlorine $Cl_2$ is supplied and the substrate W is etched by generating plasma. The processing gas may contain an inert gas such as, for example, He, $N_2$, or Ar, and may further contain $H_2$. As the processing gas, some kinds of gases which allow a selection ratio of the first magnetic layer 105 to the tunnel barrier layer 104 to be sufficiently obtained may be employed. In step S2, by a first processing gas, an area of the first magnetic layer 105 not covered with the etching mask 107 is reacted and etched, and the tunnel barrier layer 104 is not etched. Accordingly, in step S2, the etching is finished on the surface of the tunnel barrier layer 104.

In step S2, when the first magnetic layer 105 is etched by using the processing gas, for example, a material to be etched reacts with the processing gas to produce a reaction product. The reaction product is attached as a residue on the side walls of the first magnetic layer 105, the upper electrode layer 106, and the etching mask 107. The residue includes a conductive material, and thus becomes a factor that causes leakage current in the MRAM device.

Subsequently, in step S3, the substrate W is moved to the substrate processing apparatus which is the process module PM1 in order to remove the residue. In step S3, a processing gas that contains hydrogen ($H_2$) is supplied and the residue produced in step S2 is removed by generating plasma. The processing gas for removing the residue may contain an inert gas such as, for example, He, $N_2$, or Ar. When the residue is removed from the side walls of the upper electrode layer 106, the first magnetic layer 105, and the etching mask 107 in step S3, the process proceeds to step S4.

Figure 4:
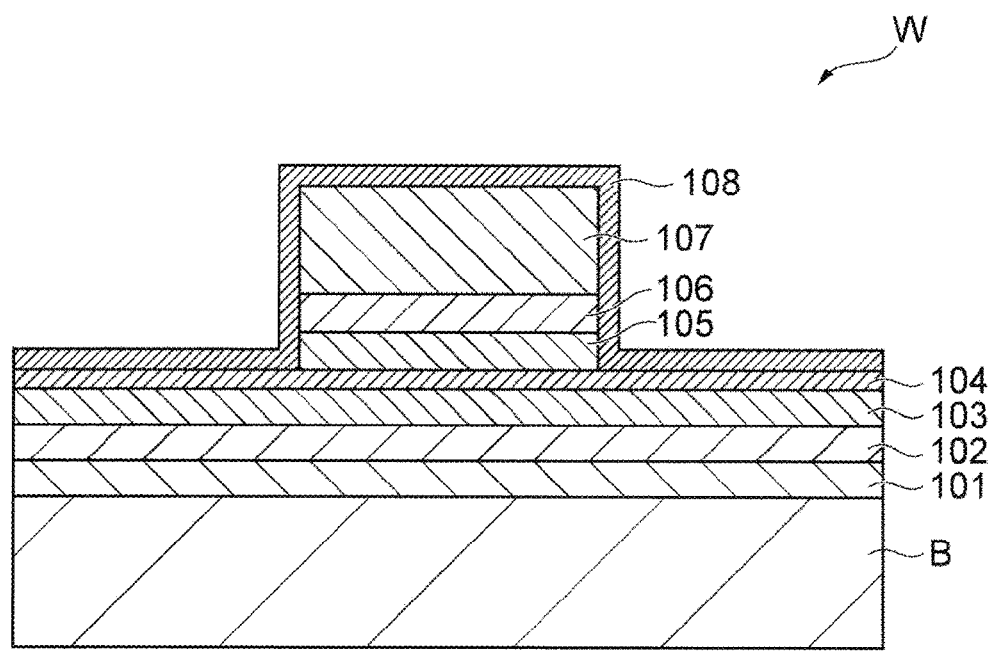
FIG. 4 is a view illustrating a substrate obtained during the manufacturing process of the MRAM device.

In the deposition method of an exemplary embodiment, subsequently, in step S4, the substrate W is moved to the deposition apparatus according to an exemplary embodiment, which is the process module PM2, and as illustrated in FIG. 4, the surface of the substrate W is coated with an insulating film 108. The insulating film 108 is made of SiN. The deposition method of the insulating film 108 will be described below. Then, the substrate W is returned to the plasma etching apparatus which is the process module PM3, and the insulating film 108 is etched so that the insulating film 108 may remain at the side walls of the first magnetic layer 105, the upper electrode layer 106 and the etching mask 107.

Subsequently, in step S5, a gas that contains methane ($CH_4$) is supplied to etch the tunnel barrier layer 104 and the second magnetic layer 103 by generating plasma. The processing gas may contain other gases besides methane, such as, for example, inert gas such as He, $N_2$, or Ar, a gas containing a carbonyl group, or $H_2$. In step S5, areas of the tunnel barrier layer 104, the second magnetic layer 103, and the pinning layer 102 not covered with the etching mask 107 and the insulating film 108 are etched. Accordingly, the pinning layer 102, the second magnetic layer 103, and the tunnel barrier layer 104 are formed to have a width larger than that of the first magnetic layer 105, the upper electrode layer 106 and the etching mask 107 by a width of the insulating film 108 formed on the side walls of the first magnetic layer 105, the upper electrode layer 106 and the etching mask 107.

Subsequently, in step S6, a processing gas is supplied and the lower electrode layer 101 is etched by generation of plasma. The processing gas may contain an inert gas such as, for example, He, $N_2$ or Ar, a gas containing a carbonyl group, or a gas such as, for example, $CH_4$, or $H_2$. In step S6, an area of the lower electrode layer 101 not covered with the etching mask 107 and the insulating film 108 are etched. Accordingly, the lower electrode layer 101 is formed to have a width larger than that of the first magnetic layer 105, the upper electrode layer 106 and the etching mask 107, by a width of the insulating film 108 formed on the side walls of the first magnetic layer 105, the upper electrode layer 106, and the etching mask 107.

When step S6 is finished, the substrate processing process as illustrated in FIG. 3 is finished. In this manner, an MRAM device in a required shape is formed from a substrate W having a multi-layered structure.

Figure 5:
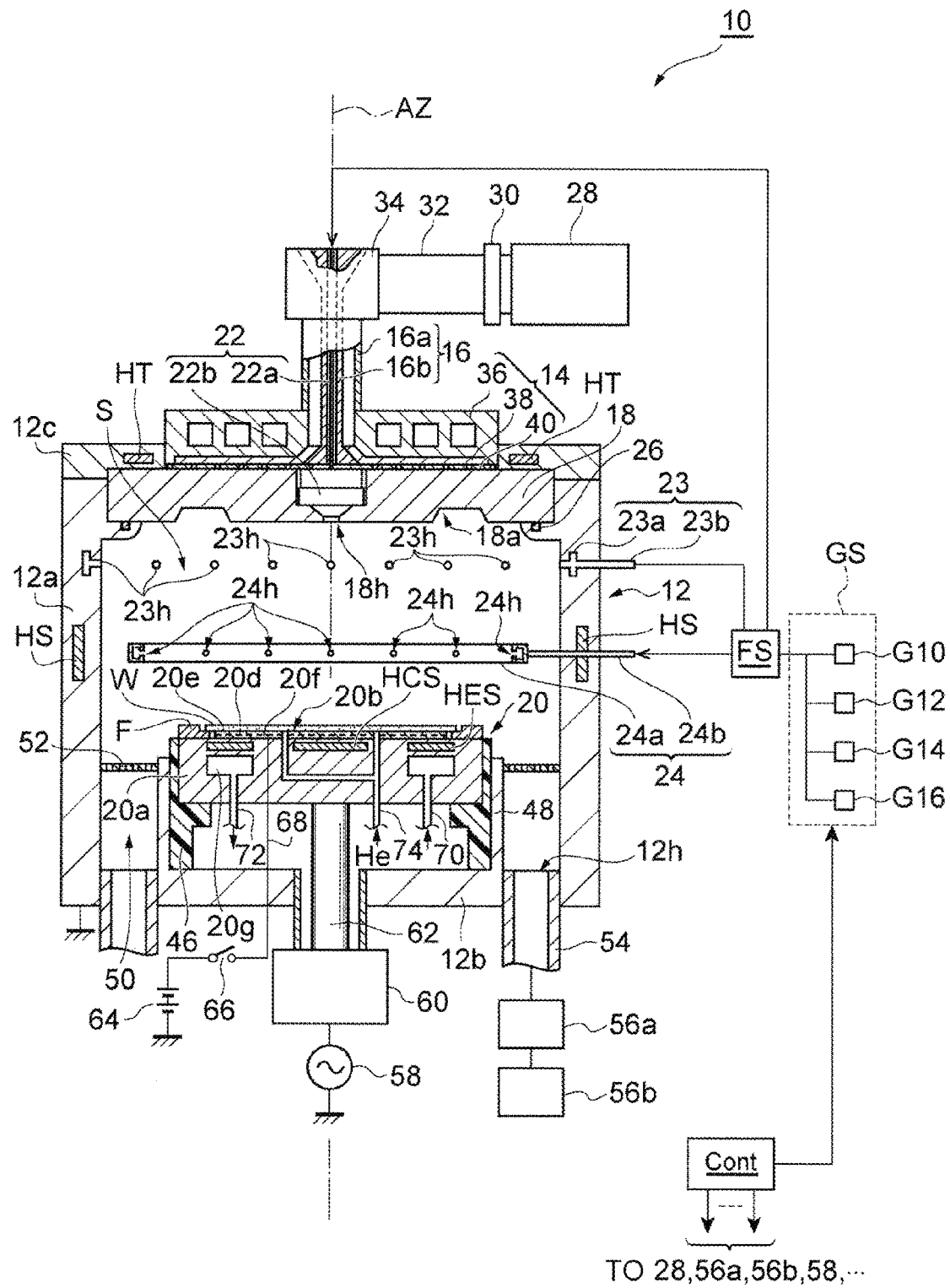
FIG. 5 is a cross-sectional view illustrating a deposition apparatus according to an exemplary embodiment.

Next, the deposition apparatus used to deposit the insulating film 108 in step 4 will be described. FIG. 5 illustrates a cross-section of the deposition apparatus configured to deposit the insulating film 108.

A deposition apparatus 10 as illustrated in FIG. 5 is provided with a processing container 12. The processing container 12 defines a processing space S in which a substrate W is accommodated. The processing container 12 may include a side wall 12a, a bottom portion 12b, and a top portion 12c. The side wall 12a has a substantially cylindrical shape which extends in the extension direction of an axis AZ (hereinafter, referred to as "axis AZ direction"). The bottom portion 12b is provided at the lower side of the side wall 12a. An exhausting hole 12h for exhaustion is provided at the bottom portion 12b. The upper end of the side wall 12a is opened. The opening at the upper end of the side wall 12a is closed by a dielectric window 18. The dielectric window 18 is pinched between the upper end of the side wall 12a and the top portion 12c. A sealing member 26 may be interposed between the dielectric window 18 and the upper end of the side wall 12a. The sealing member 26 may be, for example, an O ring, and contribute to the sealing of the processing container 12.

The deposition apparatus 10 further includes a stage 20 provided within the processing container 12. The stage 20 is provided below the dielectric window 18. In an exemplary embodiment, the stage 20 includes a holder 20a, and an electrostatic chuck 20b.

The holder 20a is supported by a cylindrical support 46. The cylindrical support 46 is made of an insulating material, and extends vertically upwardly from the bottom portion 12b. Also, a conductive cylindrical support 48 is provided around the outer circumference of the cylindrical support 46. The cylindrical support 48 extends vertically upwardly from the bottom portion 12b of the processing container 12 along the outer circumference of the cylindrical support 46. An annular exhaust passage 50 is formed between the cylindrical support 48 and the side wall 12a.

An annular baffle plate 52 formed with a plurality of through holes is installed above the exhaust passage 50. An exhaust pipe 54 that provides the exhausting hole 12h is connected to the exhaust passage 50, and an exhaust device 56b is connected to the exhaust pipe 54 via a pressure controller 56a. The exhaust device 56b includes a vacuum pump such as a turbo molecular pump. The pressure controller 56a controls the exhaust amount of the exhaust device 56b to control the pressure within the processing container 12. By the pressure controller 56a and the exhaust device 56b, the processing space S within the processing container 12 may be decompressed to a required degree of vacuum. Also, by operating the exhaust device 56b, a processing gas may be exhausted from the outer circumference of the stage 20 through the exhaust passage 50.

The holder 20a also serves as a high frequency electrode. A high frequency power source 58 for RF bias is electrically connected to the holder 20a via a matching unit 60 and a feeding rod 62. The high frequency power source 58 outputs a high frequency electric power at a predetermined frequency suitable for controlling energy of ions to be attracted to the substrate W. For example, the high frequency power source 58 outputs a high frequency power of 13.65 MHz in a predetermined power. The matching unit 60 contains a matching device configured to match the impedance at the high frequency power source 58 side with the impedance at the load side mainly such as, for example, the electrodes, the plasma, and the processing container 12. A blocking condenser configured to generate self bias is included within the matching device.

The electrostatic chuck 20b is provided on the top surface of the holder 20a. In an exemplary embodiment, the top surface of the electrostatic chuck 20b forms a disposition area on which the substrate W is disposed. The electrostatic chuck 20b maintains the substrate W by electrostatic attractive force. A focus ring F is provided to annularly surround the circumference of the substrate W at the radial outside of the electrostatic chuck 20b. The electrostatic chuck 20b includes an electrode 20d, an insulating film 20e, and an insulating film 20f. The electrode 20d is made of a conductive film, and is provided between the insulating film 20e and the insulating film 20f. A DC power source 64 with high voltage is electrically connected to the electrode 20d via a switch 66 and a covered wire 68. The electrostatic chuck 20b is capable of attracting and maintaining the substrate W on the top surface thereof by a Coulomb force generated by a DC voltage applied from the DC power source 64.

An annular refrigerant chamber 20g that extends in the circumferential direction is provided within the holder 20a. In the refrigerant chamber 20g, a refrigerant at a predetermined temperature, for example, cooling water, is circulated and supplied from a chiller unit via pipes 70 and 72. The processing temperature of the substrate W on the electrostatic chuck 20b may be controlled by the temperature of the refrigerant. Also, a heat transfer gas from a heat transfer gas supply unit, for example, He gas, is supplied between the top surface of the electrostatic chuck 20b and the rear surface of the substrate W via a gas supply tube 74.

In an exemplary embodiment, the deposition apparatus 10 may further include heaters HT, HS, HCS, and HES as temperature control devices. The heater HT is provided within the top portion 12c and annularly extends to surround an antenna 14. Also, the heater HS is provided within the side wall 12a, and annularly extends. The heater HS may be provided at, for example, a halfway position in the height direction (that is, axis AZ direction) of the processing space S. The heater HCS is provided within the holder 20a. The heater HCS is provided below the central portion of the above described disposition area, that is, at an area that intersects the axis AZ, within the holder 20a. Also, the heater HES is provided within the holder 20a, and annularly extends to surround the heater HCS. The heater HES is provided below the outer periphery portion of the above described disposition area.

Also, the deposition apparatus 10 may further include the antenna 14, a coaxial waveguide 16, a dielectric window 18, a microwave generator (plasma generating unit) 28, a tuner 30, a waveguide 32, and a mode converter 34. The microwave generator 28 generates microwave at a frequency of, for example, 2.45 GHz. The microwave generator 28 is connected to the upper portion of the coaxial waveguide 16 via the tuner 30, the waveguide 32, and the mode converter 34. The coaxial waveguide 16 extends along the axis AZ as the central axis. The coaxial waveguide 16 includes an outside conductor 16a and an inside conductor 16b. The outside conductor 16a is formed in a cylindrical shape that extends in the axis AZ direction. The lower end of the outside conductor 16a may be electrically connected to the top portion of a cooling jacket 36 having a conductive surface. The inside conductor 16b is provided inside of the outside conductor 16a. The inside conductor 16b is formed in a cylindrical shape that extends along the axis AZ. The lower end of the inside conductor 16b is connected to a slot plate 40 of the antenna 14.

In an exemplary embodiment, the antenna 14 may be disposed within the opening formed in the top portion 12c. The antenna 14 includes a dielectric plate 38 and a slot plate 40. The dielectric plate 38 shortens the wavelength of the microwave, and is formed in a substantially disk shape. The dielectric plate 38 is made of, for example, quartz or alumina. The dielectric plate 38 is pinched between the slot plate 40 and the bottom surface of the cooling jacket 36. Therefore, the antenna 14 may be constituted by the dielectric plate 38, the slot plate 40, and the bottom surface of the cooling jacket 36.

Figure 6:
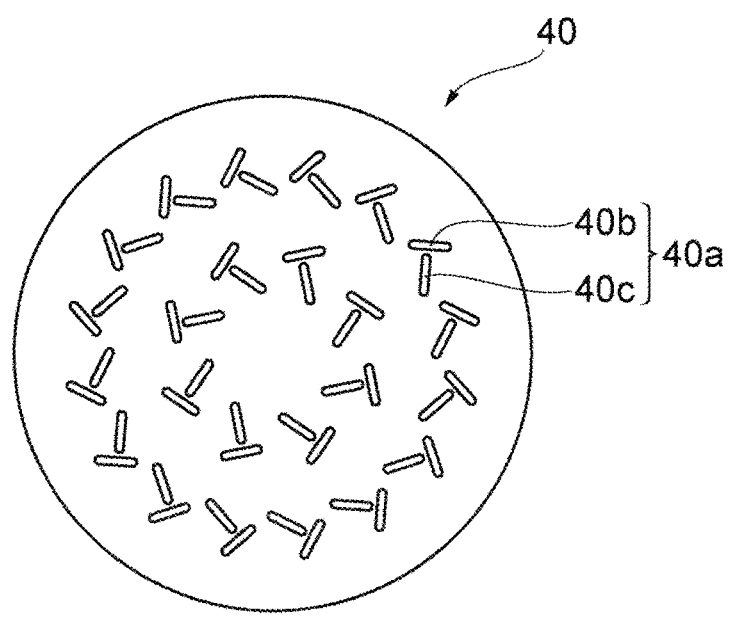
FIG. 6 is a plan view illustrating an example of a slot plate illustrated in FIG. 5.

The slot plate 40 is a metal plate which is formed with a plurality of slot pairs and formed in a substantially disk shape. In an exemplary embodiment, the antenna 14 may be a radial line slot antenna. FIG. 6 is a plan view illustrating an example of the slot plate. The plurality of slot pairs 40a are formed in the slot plate 40. The plurality of slot pairs 40a are provided in the radial direction to be spaced apart from each other at a predetermined interval. Also, the plurality of slot pairs 40a are disposed in the circumferential direction to be spaced apart from each other at a predetermined interval. The slot pairs 40a each includes two slot holes 40b and 40c. The slot holes 40b and 40c extend in a direction where they cross each other or they are perpendicular to each other.

Referring back to FIG. 5, in the deposition apparatus 10, the microwave generated by the microwave generator 28 is propagated to the dielectric plate 38 through the coaxial waveguide 16, and then is given to the dielectric window 18 from slot holes of the slot plate 40.

The dielectric window 18 is formed in a substantially disk shape, and is made of, for example, quartz or alumina. The dielectric window 18 is provided just below the slot plate 40. The dielectric window 18 allows the microwave received from the antenna 14 to transmit through the dielectric window 18 to introduce the microwave into the processing space S. By this, an electric field is generated just below the dielectric window 18, and plasma is generated within the processing space. In this manner, the deposition apparatus 10 allows the plasma to be generated using the microwave without application of a magnetic field.

In an exemplary embodiment, the bottom surface of the dielectric window 18 may define a recess 18a. The recess 18a is annularly provided around the axis AZ, and is formed in a tapered shape. The recess 18a is provided to allow a standing wave to be easily generated by the introduced microwave, and may contribute to efficient generation of the plasma by the microwave.

Also, the deposition apparatus 10 further include a central introducing unit 22, a top introducing unit 23, a periphery introducing unit 24, and a gas supply unit GS. The central introducing unit 22 injects a gas along the axis AZ toward the substrate W. The central introducing unit 22 includes a conduit 22a and an injector 22b. The conduit 22a passes through the inner hole of the inside conductor 16b of the coaxial waveguide 16. Also, the conduit 22a extends to the space defined by the dielectric window 18 along the axis AZ. The space defined by the dielectric window 18 is continued to an aperture 18h, and the aperture 18h is opened toward the processing space S. Also, the injector 22b is provided within the space defined by the dielectric window 18. A plurality of through holes that extend in the axis AZ direction are provided in the injector 22b. The central introducing unit 22 configured as described above supplies a gas to the injector 22b through the conduit 22a, and injects the gas from the injector 22b to the processing space S through the aperture 18h.

The top introducing unit 23 includes an annular tube 23a and a pipe 23b. The annular tube 23a is provided within the side wall 12a of the processing container 12 to annularly extend around the axis AZ at the halfway position in the axis AZ direction of the processing space S. A plurality of gas ejecting holes 23h opened toward the axis AZ are formed in the annular tube 23a. The plurality of gas ejecting holes 23h are annularly arranged around the axis AZ. The annular tube 23a is connected to the pipe 23b, and the pipe 23b extends to the outside of the processing container 12. The top introducing unit 23 introduces a gas into the processing space S toward the axis AZ through the pipe 23b, the annular tube 23a, and the gas ejecting holes 23h.

The periphery introducing unit 24 includes an annular tube 24a and a pipe 24b. The annular tube 24a is provided within the processing container 12 to annularly extend around the axis AZ below the annular tube 23a. A plurality of gas ejecting holes 24h opened toward the axis AZ are formed in the annular tube 24a. The plurality of gas ejecting holes 24h are arranged annularly around the axis AZ. The annular tube 24a is connected to the pipe 24b, and the pipe 24b extends to the outside of the processing container 12. The periphery introducing unit 24 introduces a gas into the processing space S toward the axis AZ through the pipe 24b, the annular tube 24a, and the gas ejecting holes 24h.

The gas supply unit GS is connected to the central introducing unit 22, the top introducing unit 23 and the periphery introducing unit 24 via a flow splitter FS. The flow splitter FS distributes a gas supplied from the gas supply unit GS to the central introducing unit 22, the top introducing unit 23 and the periphery introducing unit 24 based on a distribution ratio set by, for example, a control unit to be described later. The gas supply unit GS includes gas sources G10, G12, G14, and G16. The gas sources G10, G12, G14, and G16 are gas sources of an Ar gas, an $N_2$ gas, an $H_2$ gas, and an $N(SiH_3)_3$ (trisilylamine, hereinafter, referred to as "TSA") gas, respectively. The gas sources G10, G12, G14, and G16 are configured so that their flow rates may be controlled, and may include an open/close valve and a mass controller.

Also, as illustrated in FIG. 5, the deposition apparatus 10 may further include a control unit Cont. The control unit Cont may be a controller such as, for example, a programmable computer device. The control unit Cont may transmit a control signal to the gas supply unit GS to control flow rates of gases from the gas sources G10, G12, G14, and G16, respectively, and supplying or stopping of the gases. Also, the control unit Cont may transmit a control signal to the flow splitter FS to control the distribution ratio of a gas distributed to the central introducing unit 22, the top introducing unit 23 and the periphery introducing unit 24. Also, the control unit Cont may supply a control signal to the microwave generator 28, the high frequency power source 58 and the pressure controller 56a to control the power of microwave, the power and ON/OFF of an RF bias, and the pressure within the processing container 12.

The deposition apparatus 10 may be configured to include separate gas supply units which are the same as the gas supply unit GS, in which the gas supply units may be connected to the central introducing unit 22, the top introducing unit 23 and the periphery introducing unit 24, respectively.

The insulating film 108 is deposited using the deposition apparatus 10. Hereinafter, the deposition method of the insulating film 108 as described in step S4 will be described in detail. When depositing the insulating film 108, the control unit Cont controls the gas supply unit GS, and the flow splitter FS so that $H_2$ gas is added to the TSA gas which is a raw material gas of a film forming material, and the TSA gas is supplied into the processing space S through the central introducing unit 22, the top introducing unit 23, and the periphery introducing unit 24. The flow rate of the $H_2$ gas to be added is arbitrary. For example, when the flow rate of the TSA gas is 2.2 sccm, the flow rate of the $H_2$ gas may range from 25 sccm to 105 sccm.

Next, plasma is generated within the processing space S by the microwave supplied from the microwave generator 28. The TSA gas supplied into the processing space S is dissociated by the generation of plasma of the TSA gas, thereby generating a precursor that contributes to the deposition of a SiN film. Examples of the precursor that is dissociated from the TSA gas and becomes a material for the SiN film may include $(SiH_3)_2N$—$SiH_2$, $SiH_3NH$—$SiH_2$, and $NH_2$—$SiH_2$. The precursors are radical active species, and become film forming materials which are attached on the surface of the substrate W to form the insulating film 108 that includes SiN.

Figure 7:
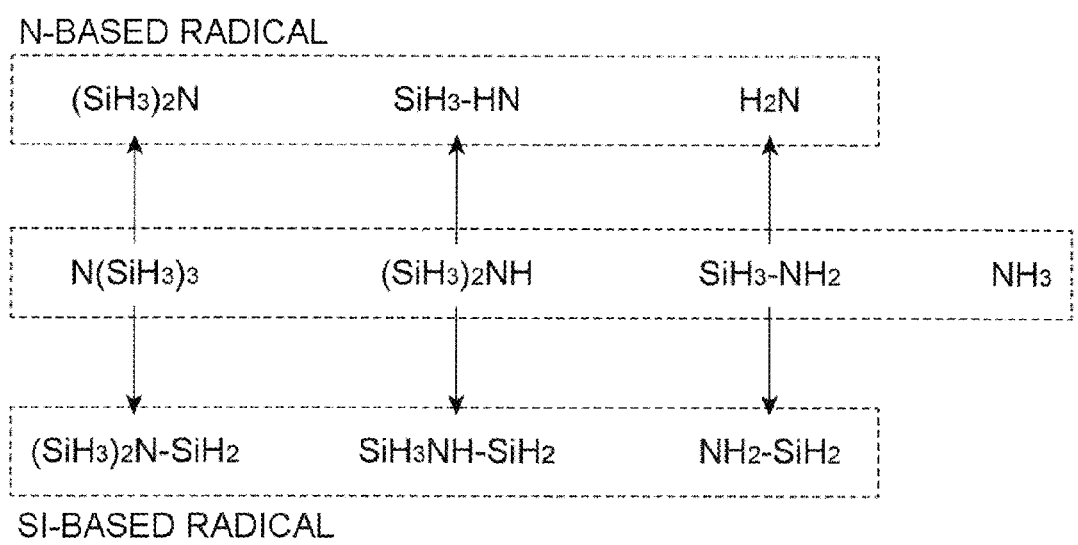
FIG. 7 is a view illustrating a dissociation pattern of trisilylamine.

The dissociation process of the TSA gas supplied into the processing space S is illustrated in FIG. 7. Within the processing space S into which the TSA gas is supplied, $N(SiH_3)_3$, $(SiH_3)_2NH$, $SiH_3$—$NH_2$, and $NH_3$ in a neutral state which are generated through decomposition of the TSA are mixed. Among these compounds, $N(SiH_3)_3$, $(SiH_3)_2NH$, and $SiH_3$—$NH_2$ are dissociated by the plasma generated within the processing space S so that radical active species may be generated. Radical active species that may be generated from the compounds may include N-based radicals and Si-based radicals. As the N-based radicals, $(SiH_3)_2N$, $SiH_3$—$HN$, and $H_2N$ may be generated. As illustrated in FIG. 7, $(SiH_3)_2N$, $SiH_3$—$HN$, and $H_2N$ are generated by dissociating $N(SiH_3)_3$, $(SiH_3)_2NH$, $SiH_3$—$NH_2$, and $NH_3$, respectively. As the Si-based radicals, $(SiH_3)_2N$—$SiH_2$, $SiH_3NH$—$SiH_2$, and $NH_2$—$SiH_2$ may be generated. As illustrated in FIG. 7, $(SiH_3)_2 N$—$SiH_2$, $SiH_3NHSiH_2$, and $NH_2$—$SiH_2$ are generated by dissociating $N(SiH_3)_3$, $(SiH_3)_2NH$, and $SiH_3$—$NH_2$, respectively.

The N-based radicals are generated by plasma at a higher electron temperature than the Si-based radicals. Specifically, the N-based radicals are generated by plasma having an electron temperature of about 5 eV. The Si-based radicals are generated by plasma having an electron temperature of about 1 eV. Here, in the deposition method of the present exemplary embodiment, plasma having a lower electron temperature is excited as compared to that from other plasma sources such as CCP, ECR, HWP, and ICP. That is, from plasma sources such as CCP, ECR, HWP, and ICP, plasma having an electron temperature ranging from about 5 to 15 eV is excited while in the deposition method of the present exemplary embodiment, plasma having an electron temperature of about 1.5 eV is excited by microwave. Accordingly, by the plasma sources such as CCP, ECR, HWP, and ICP, the TSA is dissociated to generate both N-based radicals and Si-based radicals while in the deposition method of the present exemplary embodiment, the TSA is not over-decomposed and the above described three kinds of Si-based radicals are selectively generated.

Both the N-based radicals and the Si-based radicals become deposition precursors for the SiN film, but the adsorption probability of the Si-based radicals on a silicon substrate is lower than that of the N-based radicals. FIG. 8 illustrates adsorption probabilities of $(SiH_3)_2N$—$SiH_2$, $SiH_3NH$—$SiH_2$, $NH_2$—$SiH_2$, that is, precursors generated by the deposition method of an exemplary embodiment, on Si (silicon). The adsorption probabilities are indicated as relative values with respect to an adsorption probability of $SiH_3$ as a precursor that is generated by using $SiH_4$ as a raw material gas and contributes to deposition of a SiN film. As illustrated in FIG. 8, the three kinds of precursors, that is, $(SiH_3)_2 N$—$SiH_2$, $SiH_3NH$—$SiH_2$, and $NH_2$—$SiH_2$, generated by the deposition method in an exemplary embodiment have lower adsorption probabilities on the silicon substrate, as compared to $SiH_3$.

Figure 9A:
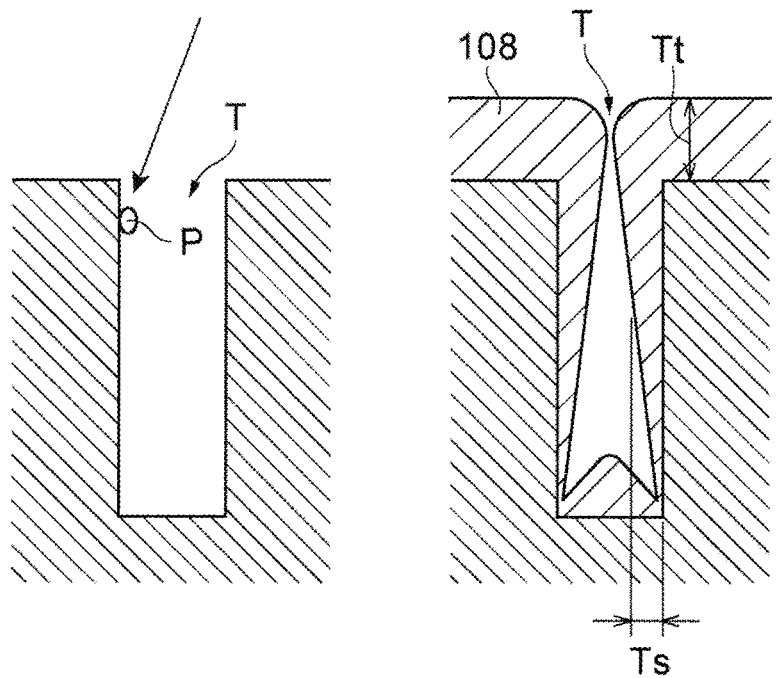
FIGS. 9A and 9B are views illustrating a relationship between an adsorption probability of a precursor and a coverage.
Figure 9B:
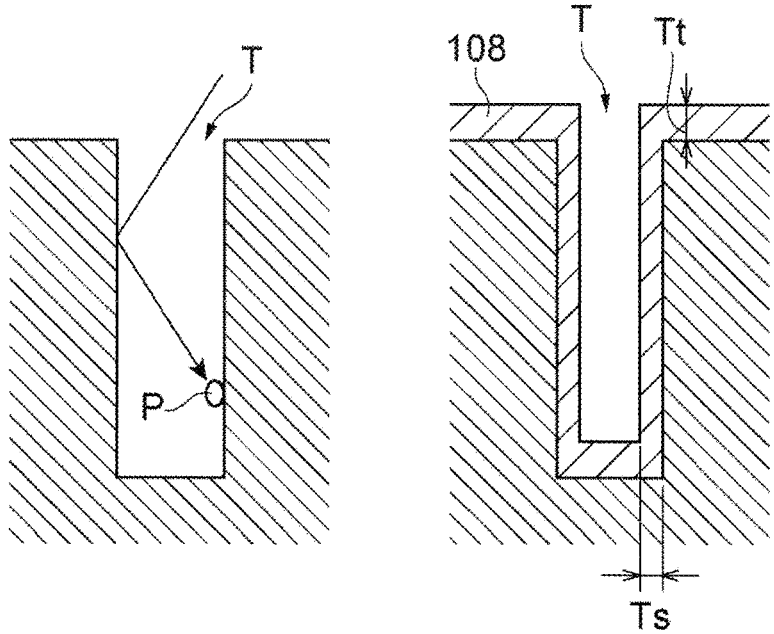

The relationship between the adsorption probability of a precursor and a coverage of an insulating film will be described. FIGS. 9A and 9B illustrate a state where a precursor P is adsorbed on a substrate surface formed with a trench structure T. The coverage is an indicator that indicates isotropy of deposition, and is indicated by a ratio of Ts/Tt, that is, a film thickness Ts of an insulating film 108 formed on the side walls of the trench T, to a film thickness Tt of the insulating film 108 formed on the outer portion of the trench T. The film thickness Ts is set as a film thickness of the insulating film 108 formed at the halfway position in the depth direction of the trench T. When the adsorption probability of the precursor P is high, as illustrated in FIG. 9A, the precursor P is adsorbed in a large amount on the upper portion or the outer portion of the trench T. Thus, the deposited insulating film has a larger film thickness at the upper portion or the outer portion of the trench T, thereby lowering the coverage. In contrast, when the adsorption probability of the precursor P is low, as illustrated in FIG. 9B, the precursor P that comes in contact with the upper portion or the outer portion of the trench T bounces at the position without being adsorbed on the substrate to randomly move. Thus, the existing amount of the precursor P becomes uniform at both inside and outside of the trench T, thereby forming a uniform film. In this manner, when the adsorption probability of the precursor P is low, the coverage of the insulator is improved.

As described above, in the deposition method of the present exemplary embodiment, TSA is used as a raw material gas for deposition of a SiN film, and plasma is excited by microwave. Thus, Si-based radicals having a low adsorption probability may be selectively generated. In this manner, in the deposition method of the present exemplary embodiment, since the Si-based radicals are selectively generated, and the insulating film is deposited by the precursor having a low adsorption probability, the coverage property of the insulating film may be improved.

When another deposition method such as an ALD method is used to deposit the insulating film 108 with a good coverage (for example, 60% or more), a process at a high temperature (for example, 400° C.) may be required, thereby deteriorating the substrate W. According to the deposition method according to the present exemplary embodiment, since plasma is generated by supplying microwave into the processing container 12, the insulating film 108 may be deposited at a low temperature (for example, 350° C. or less). Also, since $H_2$ is added to TSA gas and the TSA gas is supplied, $H_2$ is adsorbed on the surface of the substrate W, thereby lowering the adsorption probability of the precursor on the substrate W. This may improve the coverage of the insulating film 108 to be deposited on the substrate W.

Also, unlike formation of an insulating film by an ALD method, according to the deposition method of the present exemplary embodiment, an insulating film with a good film property may be deposited without using a halogen material such as, for example, dichlorosilane. Thus, the insulating film may be deposited without corroding a metal portion provided in the MRAM device 100.

Second Exemplary Embodiment

As described above, in the deposition method according to the first exemplary embodiment, in the deposition process of the insulating film 108, $H_2$ is added to TSA gas and the TSA gas is supplied into the processing container 12, thereby improving the coverage of the insulating film 108. However, there is a problem in that, although the increase of the added amount of $H_2$ improves the coverage, the insulation characteristic of the insulating film 108 is deteriorated.

When $H_2$ supplied into the processing container 12 partially forms a radical through generation of plasma of $H_2$ by microwave, SiH may be formed in the insulating film 108. The deterioration of the insulation characteristic in the insulating film 108 is caused by the formation of SiH in the insulating film 108. That is, it is supposed that when SiH increases in the insulating film 108, a semiconductive film property of Si becomes dominant rather than the original film property of SiN, thereby deteriorating the insulation characteristic. Therefore, the deposition method of the present exemplary embodiment suppresses the deterioration of insulation characteristic in the insulating film 108 to be deposited on the substrate W.

The deposition method according to the second exemplary embodiment is almost the same as the deposition method according to the first exemplary embodiment except that a nitriding processing is performed as a separate process after depositing an insulating film in order to improve an insulation characteristic. Hereinafter, for convenience of explanation and understanding, the second exemplary embodiment will be described focusing on differences from the first exemplary embodiment, and repeated descriptions will be omitted.

Figure 10:
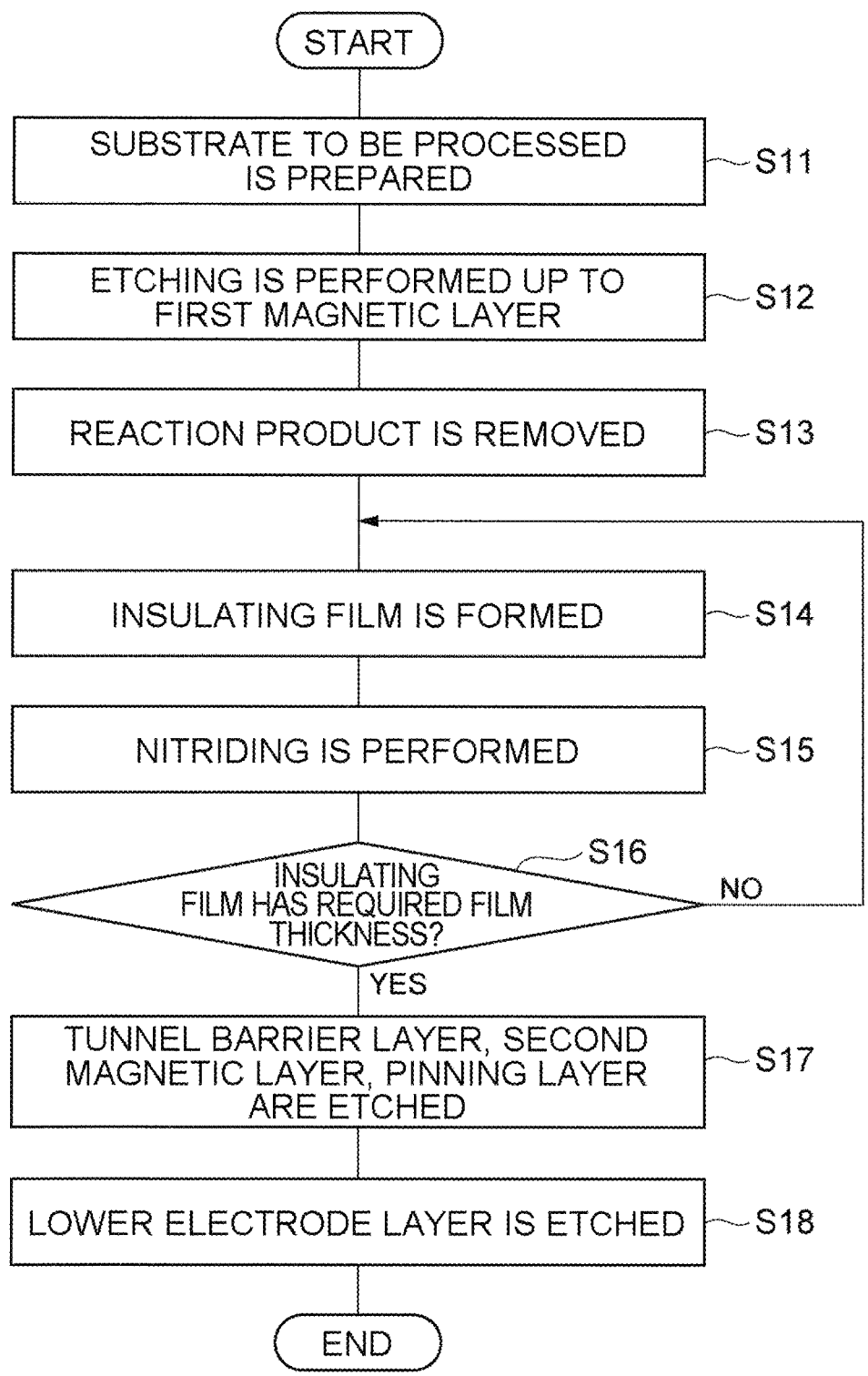
FIG. 10 is a flow chart illustrating a manufacturing process of an MRAM device using a deposition method according to another exemplary embodiment.

FIG. 10 is a flow chart illustrating a deposition method according to the second exemplary embodiment. In FIG. 10, steps S11 to S13, S17, and S18 are the same as steps S1 to S3, S5, and S6 in FIG. 3, and thus the descriptions thereof will be omitted. In the deposition method of the present exemplary embodiment, in step S14, a substrate W is moved to the deposition apparatus according to an exemplary embodiment which is the process module PM2, a gas formed by adding $H_2$ to TSA is supplied into the processing container 12, and an SiN film is deposited on a substrate surface by generating plasma to form an insulating film 108. In step S14, deposition is performed for a predetermined processing time (for example, 15 seconds) to form the insulating film 108 with a predetermined film thickness (for example, 5 nm).

In the deposition method of an exemplary embodiment, subsequently in step S15, the insulating film formed in step S14 is subjected to a nitriding processing (nitriding step). In the nitriding processing, the control unit Cont controls the gas supply unit GS, and the flow splitter FS so that a gas containing nitrogen ($N_2$) is supplied into the processing space S through the central introducing unit 22, the top introducing unit 23, and the periphery introducing unit 24. Then, by the microwave supplied from the microwave generator 28, plasma is generated within the processing space S. The $N_2$ gas supplied into the processing space S is dissociated by the plasma to substitute SiN for SiH within the insulating film 108. This reduces the amount of SiH within the insulating film 108, thereby improving the insulation characteristic.

Subsequently, in step S16, it is determined whether the insulating film 108 has a required film thickness (for example, 20 nm) or not. If the insulating film 108 is not deposited to the required film thickness, the process returns back to the processing in step S14, and the deposition and nitriding processing are repeatedly performed until the required film thickness is achieved. Meanwhile, when the insulating film 108 is deposited to the required film thickness, a processing following step S17 is performed, and then the substrate processing process as illustrated in FIG. 10 is finished. In this manner, an MRAM device with a required shape is formed from the substrate W having a multi-layered structure.

In the above described deposition method of the present exemplary embodiment, the same operational effects as those in the deposition method of the first exemplary embodiment are achieved. Also, in the deposition method of the present exemplary embodiment, after the insulating film 108 is deposited, a gas containing $N_2$ is supplied such that the insulating film is subjected to the nitriding processing. This may reduce the amount of SiH in the insulating film. As a result, the high coverage is maintained while suppressing the deterioration of the insulation characteristic in the insulating film 108.

In an exemplary embodiment, since the insulating film 108 is deposited by repeating the deposition and the nitriding processing plural times, the entire insulating film 108 may be uniformly nitrided. Therefore, the insulating film 108 with a good insulation characteristic may be formed to a required film thickness while maintaining a good coverage property.

The present disclosure has been described in detail based on exemplary embodiments thereof. However, the present disclosure is not limited to the exemplary embodiments as described above. The present disclosure may be variously varied without departing from the spirit thereof.

For example, in the above described exemplary embodiments, although the insulating film is formed on the side walls of the MRAM device 100, the insulating film may be formed on any substrate.

In the deposition method of an exemplary embodiment, in the deposition process of the insulating film 108 as described in step S4 or step S14, the pressure within the processing container 12 may be controlled to be 400 mTorr (53.3 Pa) or more. As described above, when TSA is used as the raw material gas, $(SiH_3)_2N$—$SiH_2$, $SiH_3NH$—$SiH_2$, and $NH_2$—$SiH_2$ are generated as precursors of film forming materials. The precursors exist for a long time, and have low adsorption probabilities, and thus have a characteristic that film generation is hardly performed in a gas phase, and particles are hardly generated. Thus, in the deposition method of an exemplary embodiment, the insulating film may be deposited under a high pressure condition. When the inside of the processing container is under a high pressure, a mean free path is shortened, and the precursors may easily move in a random direction. Therefore, under a high pressure condition of 400 mTorr or more, the precursors may be uniformly grown on the surface of the substrate W, thereby improving the coverage property of an insulator. Also, in the deposition method of the exemplary embodiment, the pressure within the processing container in the deposition process may be 2 Torr or less.

EXAMPLES

Hereinafter, the present disclosure will be described in more detail with reference to Examples and Comparative Examples, but the present disclosure is not limited to the following Examples.

Example 1

Figure 11:
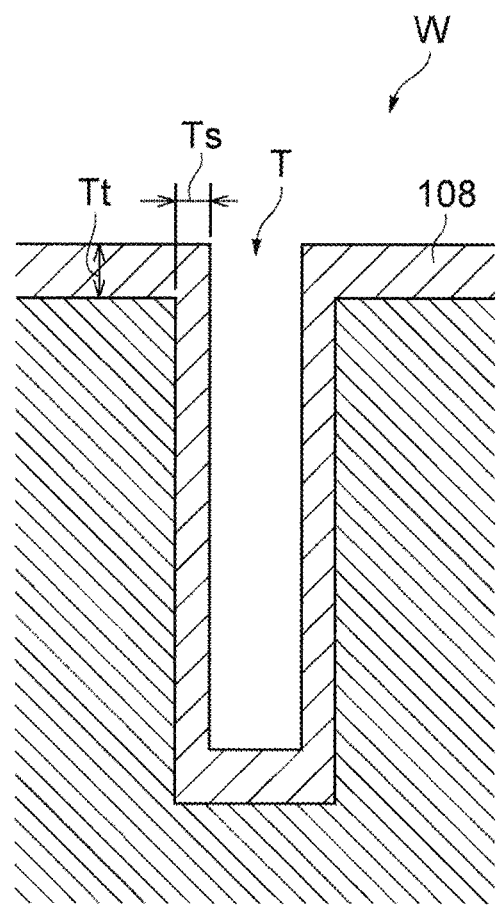
FIG. 11 is a view schematically illustrating a silicon wafer for evaluation.

In the present example, insulating films were deposited by the deposition apparatus 10 as illustrated in FIG. 5 while changing the flow rate of $H_2$ when $H_2$ was being added to TSA. Then, the relationship between the flow rate of $H_2$ and the coverage property was evaluated. As substrates W, silicon wafers for evaluation each of which was formed with a trench structure T at an aspect ratio (opening width/depth) of 0.7, as illustrated in FIG. 11, were used. The insulating films 108 were deposited under the following processing conditions. As illustrated in FIG. 11, when the film thickness of the insulating film 108 on the outer portion of the trench T of each substrate W was Tt, and a film thickness on the side walls of the trench T was Ts, the ratio (Ts/Tt) of film thickness Ts to film thickness Tt was calculated as a coverage indicated by %. The film thickness Ts was set as a film thickness of the insulating film 108 formed at the halfway position in the depth direction of the trench T.

[Processing Conditions of Deposition Process]
Electric power of the microwave generator 28: 4000 W
Pressure: 0.95 Torr
Processing temperature: 300° C.
Flow Rates of Gases
Ar gas: 2850 sccm
$N_2$ gas: 2.8 sccm
$H_2$ gas: 35 sccm, 70 sccm, 87 sccm
TSA gas: 2.2 sccm The relationship between the flow rate of $H_2$ and the coverage of the insulating film 108, which is obtained in Example 1, is illustrated in FIG. 12. As illustrated in FIG. 12, when the flow rates of $H_2$ were 35 sccm, 70 sccm, and 87 sccm, SiN films were formed with coverages of 83%, 88%, and 91%, respectively. In this manner, a gas formed by adding $H_2$ to TSA forms the insulating film 108 by generating plasma of the gas. Thus, it was confirmed that the insulating films 108 were formed with a good coverage property. It was also confirmed that an increase of the flow rate of added $H_2$ improved the coverage of the insulating films 108.

Also, in the present example, insulating films 108 were deposited while changing the flow rate of $H_2$ when $H_2$ was being added to TSA. Then, the relationship between the added amount of $H_2$ and the insulation characteristic of the insulating films 108 was evaluated. The insulating films 108 were deposited under the following processing conditions.

Figure 13:
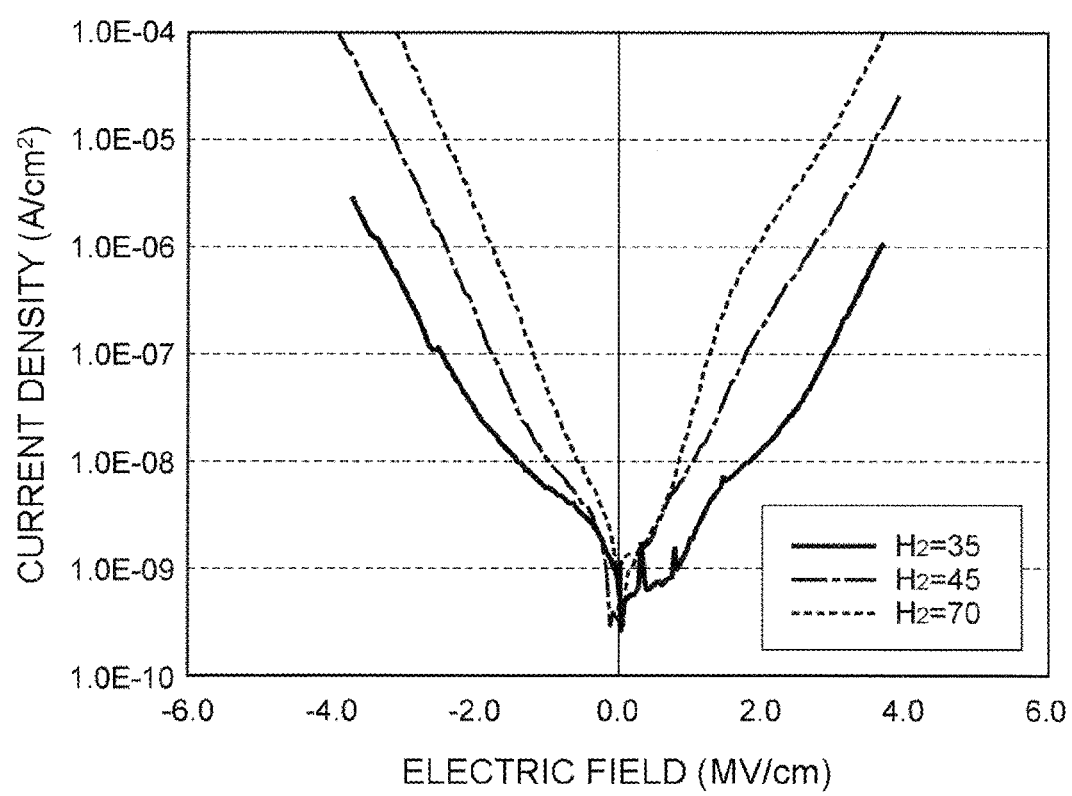
FIG. 13 is a view illustrating an insulation characteristic of the insulator obtained from Example 1.
Figure 14:
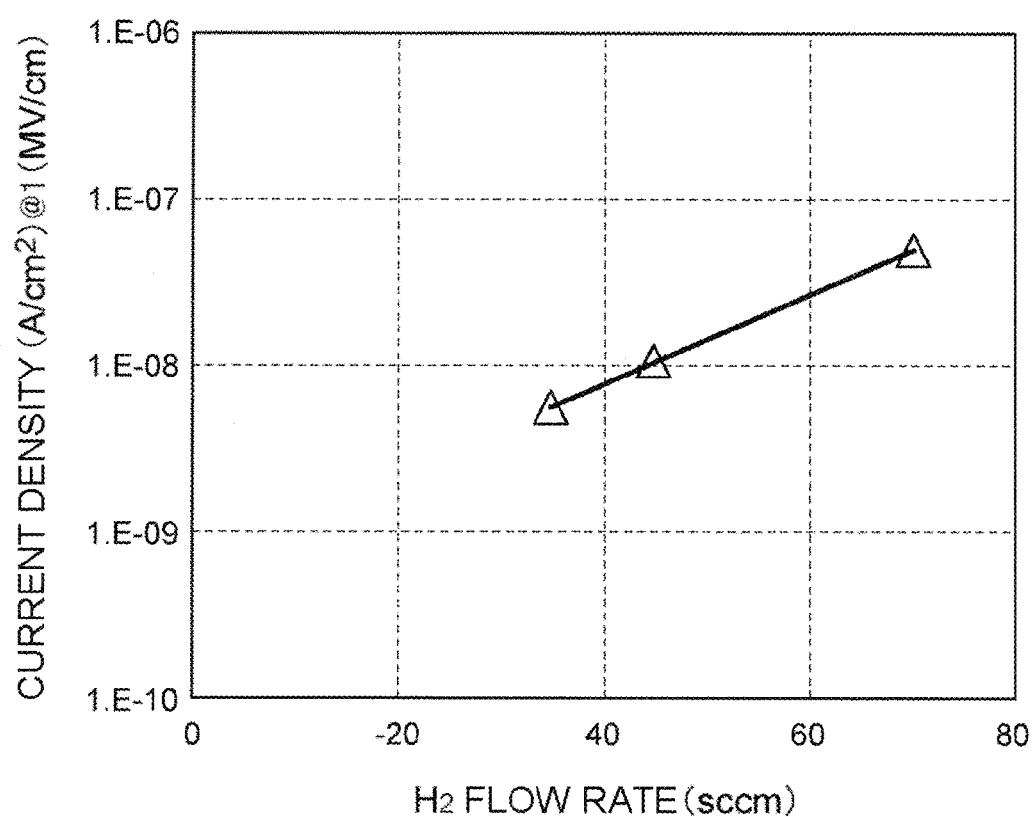
FIG. 14 is a view illustrating an insulation characteristic of the insulator obtained from Example 1.

[Processing Conditions of Deposition Process]
Electric power of the microwave generator 28: 4000 W
Pressure: 0.95 Torr
Processing temperature: 300° C.
Flow Rates of Gases
Ar gas: 2850 sccm
$N_2$ gas: 3.6 sccm
$H_2$ gas: 35 sccm, 70 sccm, 105 sccm
TSA gas: 2.2 sccm FIG. 13 is a graph illustrating the insulation characteristics of the insulating films 108 in a state where the insulating films 108 were deposited under the above described processing conditions while changing the added amount of $H_2$ (35 sccm, 70 sccm, and 105 sccm). In FIG. 13, the horizontal axis represents an electric field applied to an insulator, and the vertical axis represents a current density occurring within the insulator. In FIG. 14, the horizontal axis represents the added amount of $H_2$, and the vertical axis represents a current density occurring within the insulating films 108. FIG. 14 is a graph illustrating current densities occurring within the insulating films 108 for respective flow rates of $H_2$ when an electric field of 1 MV/cm was applied to the insulating films 108. As illustrated in FIGS. 13 and 14, it was confirmed that as the flow rate of $H_2$ gas added when depositing the insulating films 108 was increased, the current amount occurring within the insulating films 108 was also increased, thereby deteriorating the insulation characteristic of the insulating films 108.

Figure 15:
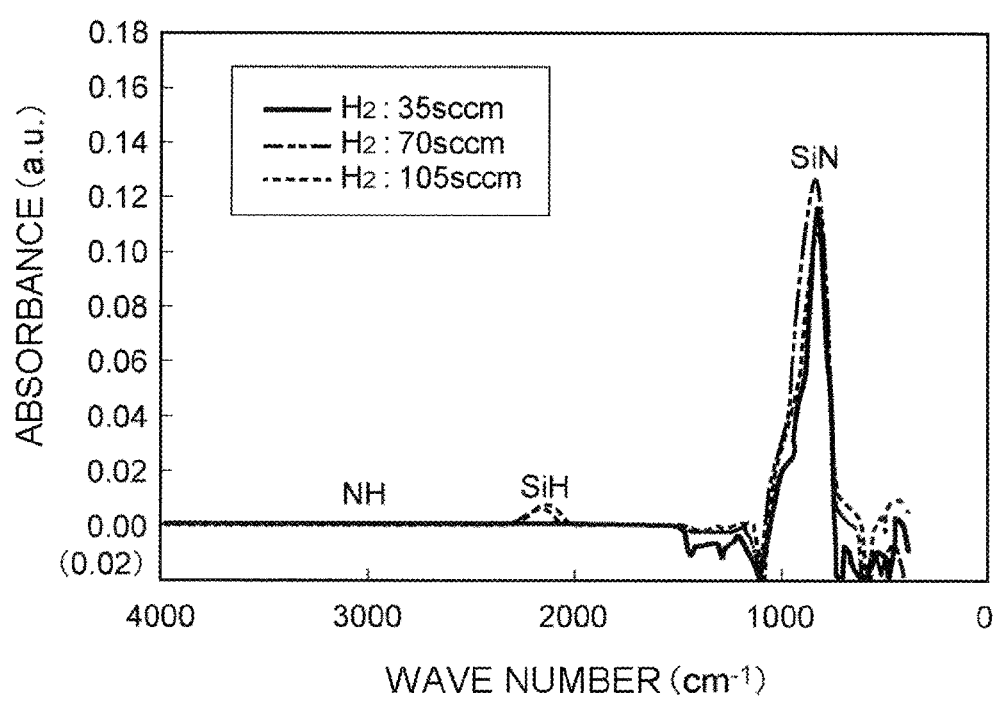
FIG. 15 is a view illustrating a spectrum waveform of FT-IR spectroscopy analysis on the insulator obtained from Example 1.

FIG. 15 illustrates spectrum waveforms of the insulating films 108 deposited while changing the added amount of $H_2$ to 35 sccm, 70 sccm, and 105 sccm as described above. The spectrum waveforms were obtained by analyzing the insulating films 108 through Fourier transform infrared spectroscopy (FT-IR spectroscopy). In the graph illustrated in FIG. 15, the horizontal axis represents wave number, and the vertical axis represents absorbance. FIG. 15 illustrates waveforms with a wave number ranging from 0 $cm^{-1}$ to 4000 $cm^{-1}$, and FIG. 16 illustrates waveforms with a wave number ranging from 2000 $cm^{-1}$ to 2500 $cm^{-1}$.

Figure 16:
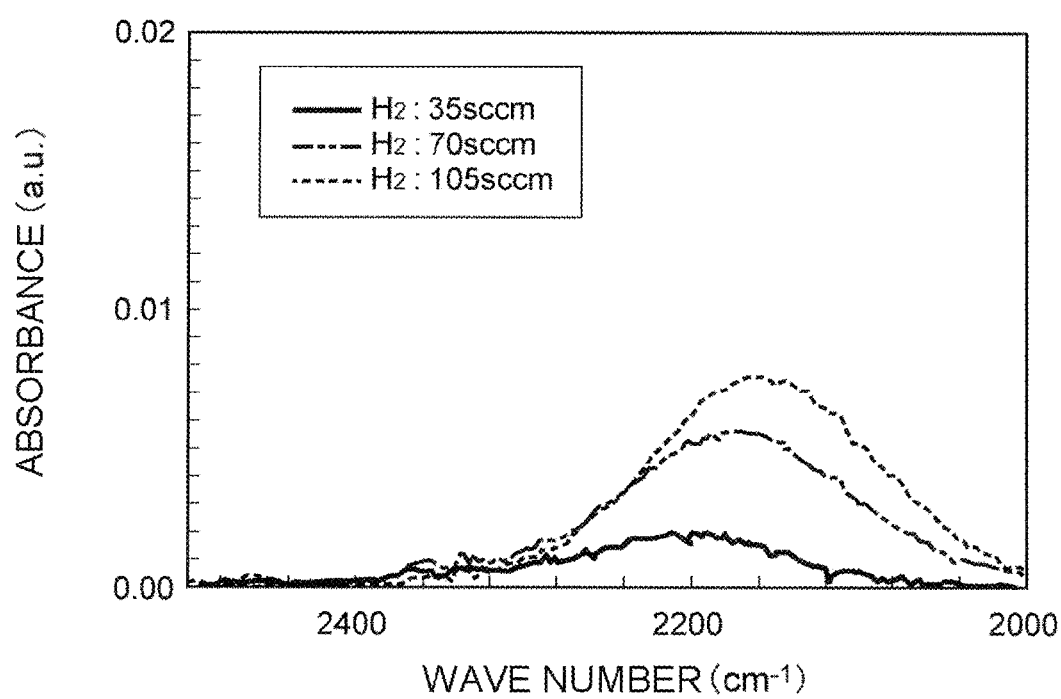
FIG. 16 is a view illustrating a spectrum waveform of FT-IR spectroscopy analysis on the insulator obtained from Example 1.

As illustrated in FIGS. 15 and 16, through FT-IR analysis, spectrums were obtained in which as the flow rate of $H_2$ gas added when depositing the insulating films 108 increased, the absorbance also increased at the absorption peaks derived from SiH (around 2100 $cm^{-1}$ to 2200 $cm^{-1}$). This represents that as the flow rate of $H_2$ gas added when depositing the insulating films 108 increases, SiH exists in a large amount within the insulating films 108. Accordingly, it was confirmed that as the flow rate of $H_2$ gas added when depositing the insulating films 108 increased, the amount of SiH was also increased, and thus SiH contributed to the deterioration of the insulation characteristic.

Example 2

In the present example, insulating films 108 were deposited by the deposition apparatus 10 as illustrated in FIG. 5 while changing the deposition pressure. Then, the relationship between the deposition pressure and the coverage property was evaluated. In the present example, as substrates W, silicon wafers for evaluation which were the same as those used in Example 1 were used. The insulating films 108 were formed under the following processing conditions.

Figure 17:
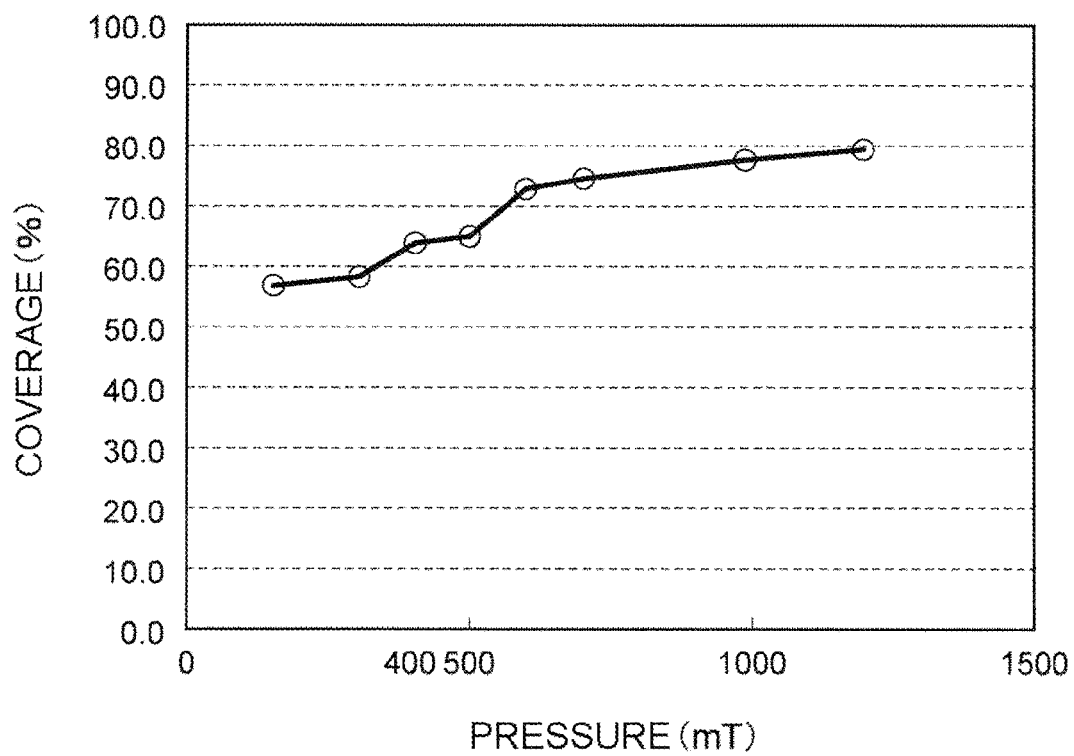
FIG. 17 is a view illustrating the relationship between a deposition pressure and a coverage, which is obtained in Example 2.

[Processing Conditions of Deposition Process]
Electric power of the microwave generator 28: 4000 W
Processing temperature: 200° C.
Flow Rates of Gases
Ar gas: 2000 sccm
$N_2$ gas: 8 sccm
$H_2$ gas: 100 sccm
TSA gas: 4.5 sccm The relationship between the deposition pressure of the insulating films 108 deposited in Example 2 and the coverage is illustrated in FIG. 17. As illustrated in FIG. 17, it was confirmed that as the deposition pressure is increased, the coverage is improved. It is estimated that the high pressure shortens the mean free path, and allows precursors to be moved in random directions, and thus the precursors are attached even on the side walls of the trench T, thereby improving the coverage. Also, it was confirmed that when the pressure within the processing container 12 is set to be 400 mTorr or more during the deposition, a coverage of 60% or more which is generally required in depositing a SiN film on a substrate having a trench structure is achieved.

Example 3

In the present example, the coverage property and the insulation characteristic of an insulating film 108 deposited and then subjected to a nitriding processing by the deposition apparatus 10 as illustrated in FIG. 5 were evaluated. Hereinafter, the insulating film 108 will be referred to as "insulating film 1". The processing conditions of insulating film 1 are described below. In the present example, silicon wafers for evaluation which are the same as those used in Example 1 were used as substrates W.

[Insulating Film 1]
[Processing Conditions of Deposition]
Electric power of the microwave generator 28: 4000 W
Processing temperature: 300° C.
Pressure: 0.95 Torr
Flow Rates of Gases
Ar gas: 2850 sccm
$N_2$ gas: 2.8 sccm
$H_2$ gas: 70 sccm
TSA gas: 2.2 sccm
Processing time: 130 sec
[Conditions of Nitriding Processing]
Electric power of the microwave generator 28: 4000 W
Processing temperature: 300° C.
Pressure: 0.05 Torr
Flow Rates of Gases
Ar gas: 600 sccm
$N_2$ gas: 2.8 sccm
$H_2$ gas: 70 sccm
TSA gas: 0 sccm
Processing time: 60 sec As a comparative example, the coverage property and the insulation characteristic of an insulating film formed by using $SiH_4$ as a raw material gas were also evaluated. Hereinafter, the insulating film will be referred to as "insulating film 2". Also, in the present example, the coverage property and the insulation characteristic of insulation films which were deposited while changing the flow rate of $H_2$ when $H_2$ is being added to TSA in two steps without performing a nitriding processing were evaluated. Hereinafter, the insulating films will be referred to as "insulating film 3" and "insulating film 4", respectively. The processing conditions of the insulating films 2 to 4 are as follows.

Figure 18:
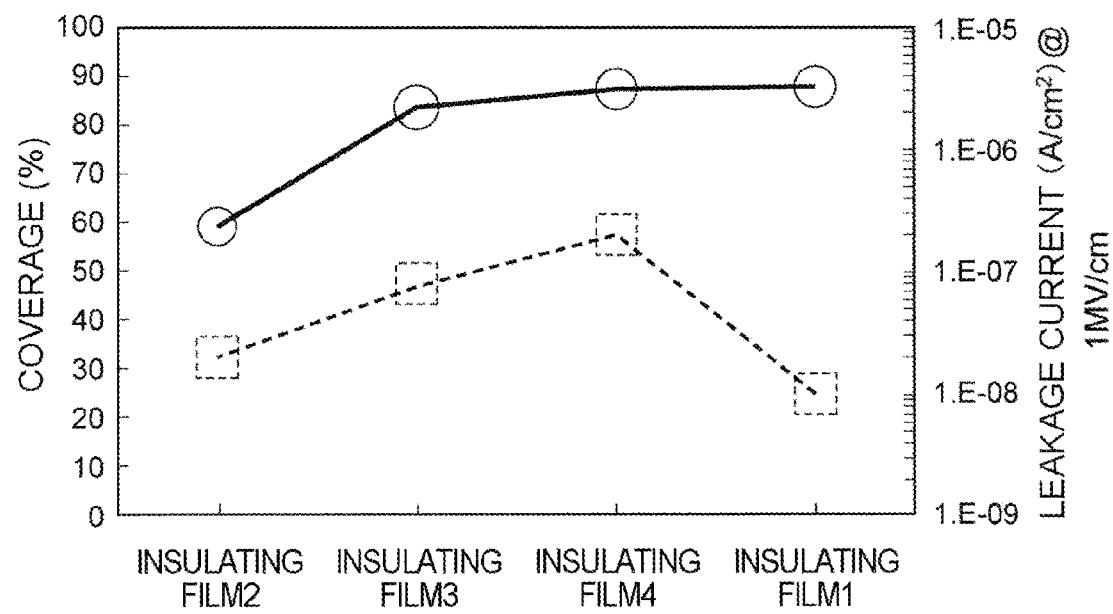
FIG. 18 is a view illustrating a coverage and an insulation characteristic of an insulator obtained in Example 3.

[Insulating Film 2]
[Processing Conditions of Deposition]
Electric power of the microwave generator 28: 4000 W
Processing temperature: 200° C.
Pressure: 0.15 Torr
Flow Rates of Gases
Ar gas: 600 sccm
$N_2$ gas: 9.3 sccm
$H_2$ gas: 70 sccm
$SiH_4$ gas: 15 sccm
Processing time: 78 sec
[Insulating Film 3]
[Processing Conditions of Deposition]
Electric power of the microwave generator 28: 4000 W
Processing temperature: 300° C.
Pressure: 0.95 Torr
Flow Rates of Gases
Ar gas: 2850 sccm
$N_2$ gas: 3.6 sccm
$H_2$ gas: 35 sccm
TSA gas: 2.2 sccm
Processing time: 268 sec
[Insulating Film 4]
[Processing Conditions of Deposition]
Electric power of the microwave generator 28: 4000 W
Processing temperature: 300° C.
Pressure: 0.95 Torr
Flow Rates of Gases
Ar gas: 2850 sccm
$N_2$ gas: 3.6 sccm
$H_2$ gas: 70 sccm
TSA gas: 2.2 sccm
Processing time: 268 sec The coverage properties and insulation characteristics of insulating film 1 which were subjected to the nitriding processing and insulating films 2, 3 and 4 which were not subjected to the nitriding processing are illustrated in FIG. 18. In FIG. 18, the solid line represents the coverage of the insulating films 108, and the dotted line represents the insulation characteristic of the insulating films 108. As illustrated in FIG. 18, it was confirmed that insulating film 1 which was subjected to the nitriding processing after depositing the insulating film in a state where $H_2$ is added to TSA maintains a coverage similar to those of insulating films 3 and 4, and reveals the reduction of leakage current as compared to insulating films 2 to 4. That is, it was confirmed that insulating film 1 was improved in insulation characteristic.

Figure 19A:
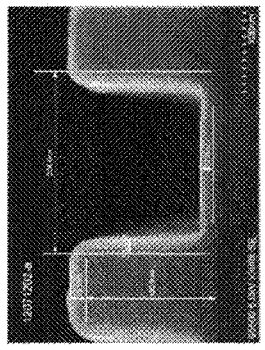
FIGS. 19A to 19C are SEM images and their schematic views of a to-be-processed substrate obtained in Example 3.
Figure 19A:
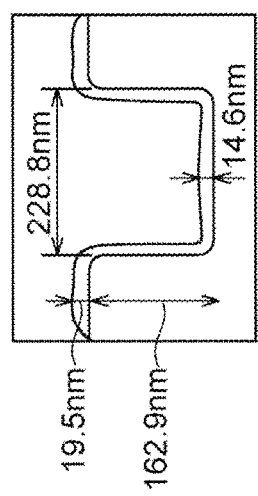
Figure 19B:
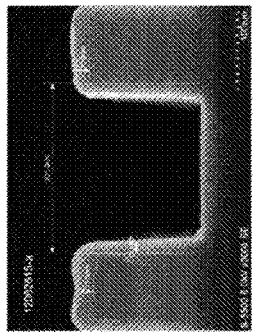
Figure 19B:
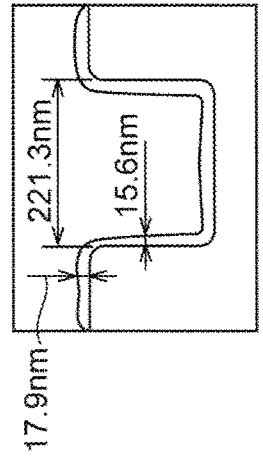
Figure 19C:
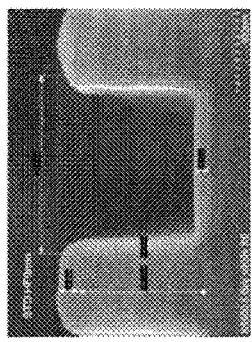
Figure 19C:
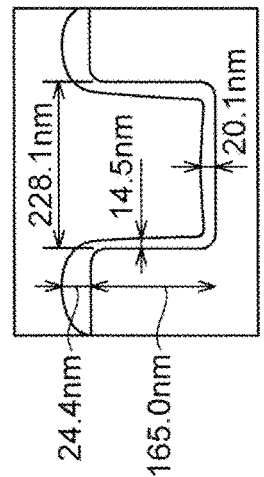

FIGS. 19A to 19C illustrate cross-sectional SEM images of substrates W formed with the insulating films 108, and the schematic views thereof. FIGS. 19A, 19B, and 19C illustrate cross-sectional SEM images and the schematic views of insulating films 2, 4, and 1, respectively. As illustrated in FIGS. 19A to 19C, it was confirmed that insulating films 1 and 4 are formed on the surfaces of the substrates W more isotropically than insulating film 2.

Example 4

In the present example, evaluation was made on the coverage property and the insulation characteristic of insulating films 108 which were deposited by the deposition apparatus 10 as illustrated in FIG. 5. After the deposition, a time for nitriding processing was varied. In the present example, silicon wafers for evaluation which were the same as those used in Example 1 were used substrates W. The processing conditions of the present example were the same as those in the insulating film 1 in Example 3 except for the time for nitriding processing.

Figure 20:
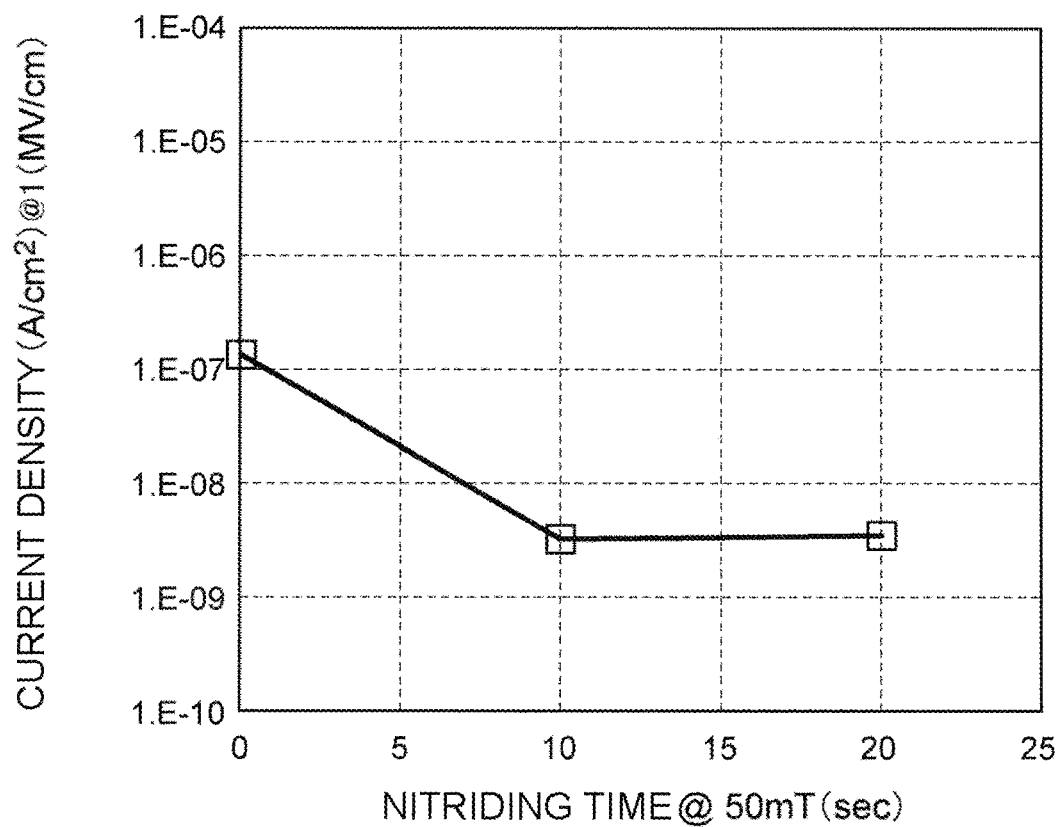
FIG. 20 is a view illustrating a relationship between a nitriding time and an insulation characteristic, which is obtained in Example 4.

The coverage property and the insulation characteristic of the insulating films formed by Example 4 are illustrated in FIG. 20. As illustrated in FIG. 20, it was confirmed that although the insulation characteristic of the insulating films 108 was immediately improved when the nitriding processing was performed, the insulation characteristic was not improved any more when the processing time exceeded 10 seconds. Accordingly, it was confirmed that when the processing time for nitriding processing is about 10 seconds, the insulation characteristic may be sufficiently improved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A method of depositing an insulating film on a substrate, the method comprising:
providing a deposition apparatus including a processing container that defines a processing space in which plasma is generated, a gas supply unit configured to supply gas into the processing space, and a plasma generating unit configured to generate plasma by supplying microwave into the processing container;
depositing an insulating film that includes SiN on the substrate by supplying a mixed gas formed by adding $H_2$ to trisilylamine into the processing container and generating plasma in the processing space;

after the depositing of the insulating film including SiN, substituting SiH remaining within the insulating film with SiN by supplying a gas including $N_2$ and generating plasma; and repeating the depositing and the substituting plural times, wherein, during the depositing of the insulating film, a pressure within the processing container is controlled to be 400 mTorr or more, and the pressure within the processing container during the depositing of the insulating film is higher than a pressure within the processing container during the substituting of the insulating film, and a processing time for the substituting of the insulating film ranges from 10 seconds to 20 seconds.

2. The method of claim 1, wherein the substrate includes a layered structure in which a first magnetic layer and a second magnetic layer are stacked with a tunnel barrier layer interposed therebetween.

3. The method of claim 1, wherein a processing temperature is controlled to be in a range from 200° C. to 350° C. in the depositing and the substituting of the insulating film.

4. An apparatus of depositing a film on a substrate, the apparatus comprising:

a processing container that defines a processing space in which plasma is generated;

a gas supply unit configured to supply a gas into the processing space;

a plasma generating unit configured to generate the plasma by supplying microwave into the processing container; and a control unit configured to control the gas supply unit and the plasma generating unit in such a manner that at least a portion of a mixed gas formed by adding $H_2$ to trisilylamine is supplied into the processing container and plasma is generated so as to deposit an insulating film that includes SiN on the substrate, and after depositing the insulating film, a gas including $N_2$ is supplied into the processing container and plasma is generated so as to substitute SiH remaining within the insulating film with SiN, wherein the control unit controls the gas supply unit and the plasma generating unit so as to repeat the deposition of the insulating film and the substitution of the SiH with SiN plural times, the control unit controls a pressure within the processing container to be 400 mTorr or more during the depositing of the insulating film, and the pressure within the processing container during the depositing of the insulating film is higher than a pressure within the processing container during the substituting of the insulating film, and the control unit performs the substitution of the insulating film for a time period ranging from 10 seconds to 20 seconds.

* * * * *